(12) United States Patent
Tazzari et al.

(10) Patent No.: US 8,217,640 B2
(45) Date of Patent: Jul. 10, 2012

(54) METHOD AND DEVICE FOR DETERMINING THE PHASES IN A MULTI-PHASE ELECTRICAL SYSTEM

(75) Inventors: Davide Tazzari, Arezzo (IT); Filippo Vernia, La Spezia (IT)

(73) Assignee: Power-One Italy S.p.A., Arezzo (IT)

( * ) Notice: Subject to any disclaimer, the term of this patent is extended or adjusted under 35 U.S.C. 154(b) by 253 days.

(21) Appl. No.: 12/740,650

(22) PCT Filed: Oct. 29, 2007

(86) PCT No.: PCT/IT2007/000751
§ 371 (c)(1),
(2), (4) Date: Apr. 29, 2010

(87) PCT Pub. No.: WO2009/057164
PCT Pub. Date: May 7, 2009

(65) Prior Publication Data
US 2010/0237852 A1  Sep. 23, 2010

(51) Int. Cl.
*G01R 19/00* (2006.01)

(52) U.S. Cl. .................... 324/66; 324/76.52; 324/76.77; 702/72

(58) Field of Classification Search .................. None
See application file for complete search history.

(56) References Cited

U.S. PATENT DOCUMENTS

| | | | |
|---|---|---|---|
| 6,667,610 B2 * | 12/2003 | Piesinger | ........................ 324/66 |
| 2004/0263147 A1 | 12/2004 | Piesinger | |
| 2006/0113984 A1 | 6/2006 | Marsden et al. | |

FOREIGN PATENT DOCUMENTS

| | | |
|---|---|---|
| DE | 19713282 | 8/1998 |
| EP | 0899575 | 8/1998 |
| JP | 200357286 | 2/2003 |
| WO | WO2006100695 | 9/2006 |

\* cited by examiner

*Primary Examiner* — Minh N Tang
(74) *Attorney, Agent, or Firm* — Waddey & Patterson, P.C.; Mark J. Patterson

(57) ABSTRACT

A method and device for determining the phases in a multi-phase electrical system includes detecting a first waveform on a phase of the multi-phase system In a first position of the multi-phase electrical system timed data is stored, synchronized with the first waveform. A second waveform is detected in a second position of the multi-phase electrical system, on an indeterminate phase of the system. Data is obtained relative to the phase on which the second waveform was read on the basis of the phase shift between the timed data and the second waveform.

16 Claims, 5 Drawing Sheets

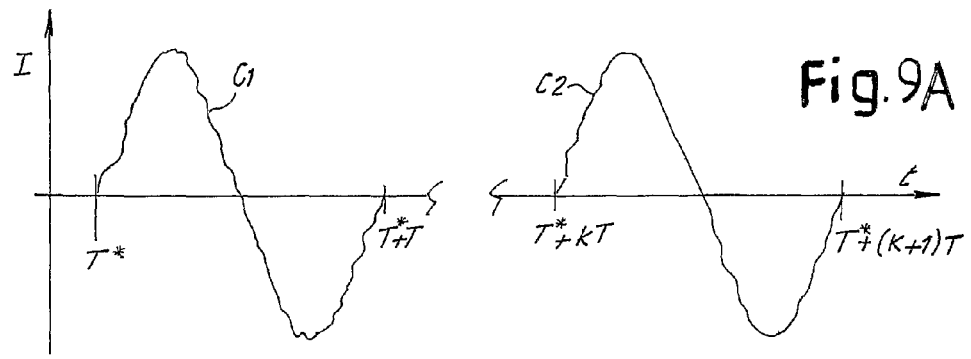
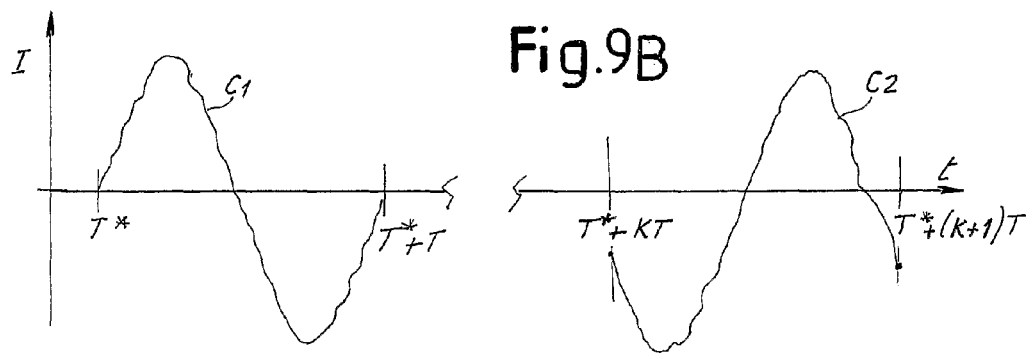
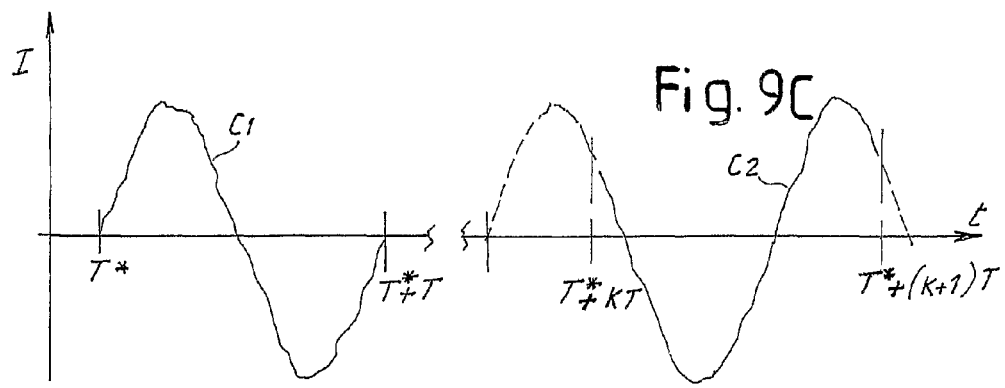
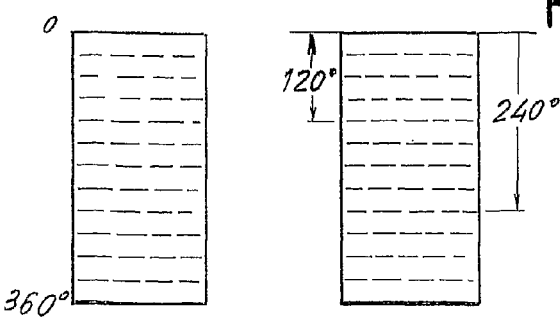

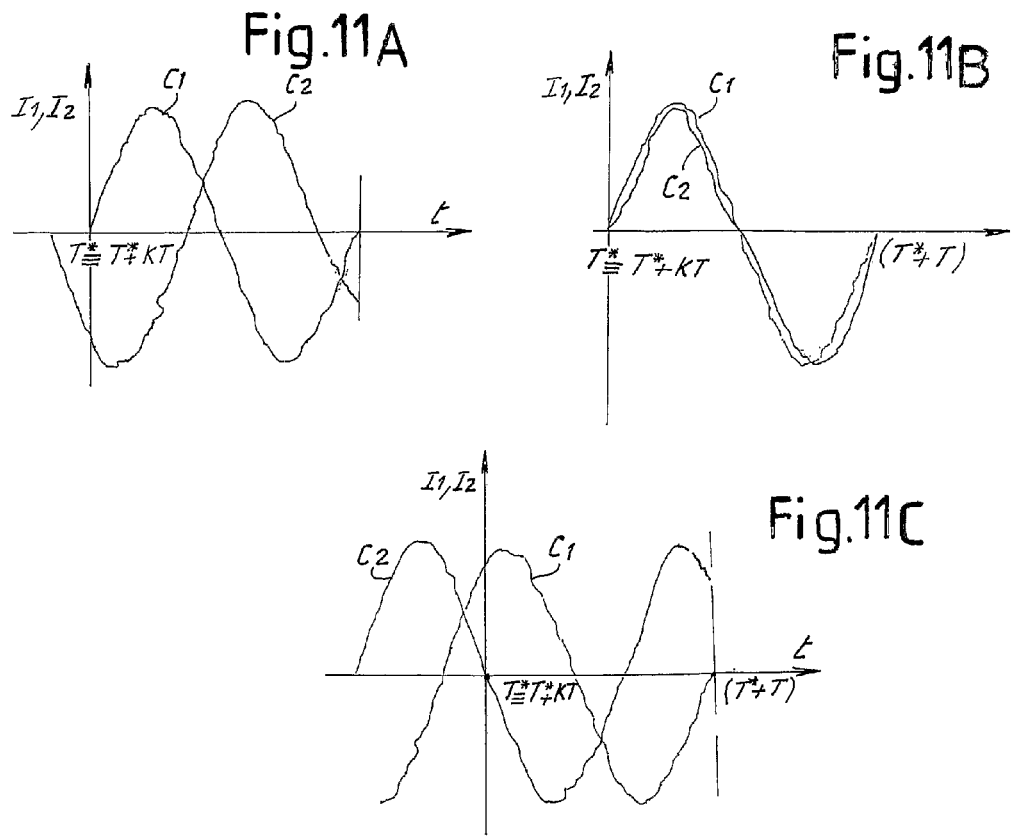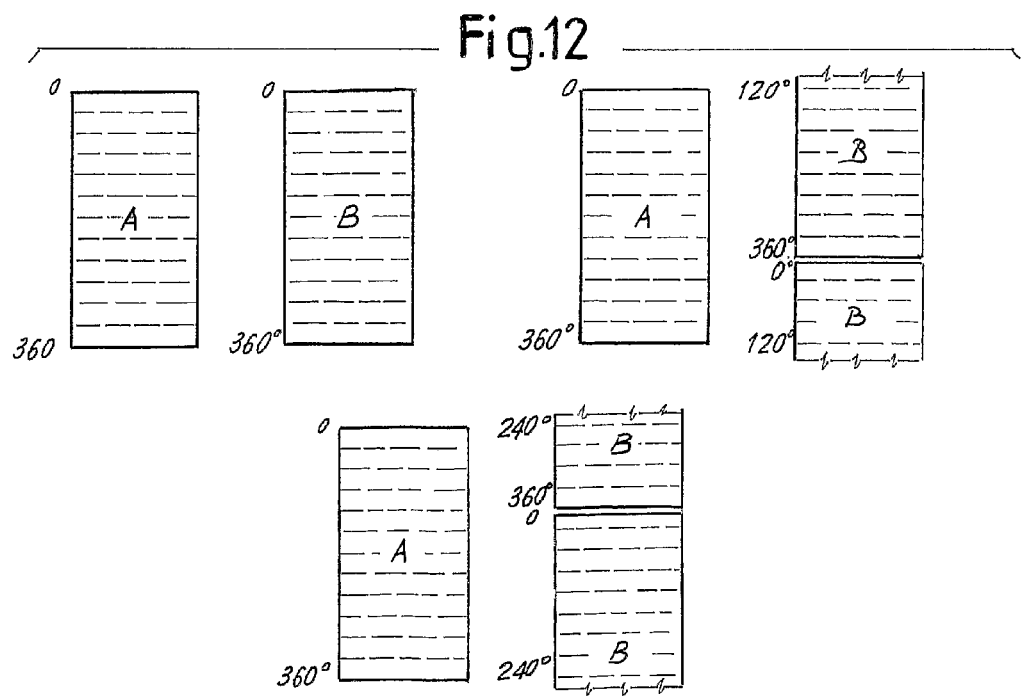

METHOD AND DEVICE FOR DETERMINING THE PHASES IN A MULTI-PHASE ELECTRICAL SYSTEM

TECHNICAL FIELD

The present invention relates to a phase detector device and a method for detecting a phase in a multi-phase electrical system, typically a three-phase system.

BACKGROUND OF THE INVENTION

In electrical energy distribution systems in urban areas, interconnection lines connect the nodes of a complex network constituted by transformer stations, in which medium to low voltage transformers supply energy to the network, and by junction or interconnection boxes, in which several lines are interconnected. The distribution system is three-phase and the distribution lines contain a plurality of cables for each phase. This is necessary in view of the high current transmitted along the lines.

The cables of the various phases forming a line are often impossible to distinguish and are distributed in a disorderly manner. Identifying the phase to which one of these cables belongs is consequently a difficult and dangerous operation. In fact, work often has to be carried out on lines while they are live.

Also in other situations, for example, when connecting equipment to a three-phase line, it may be necessary to identify the individual phases of an electrical power supply system in a fast and safe manner, even without disconnecting the power supply.

WO-A-2006/100695 describes a phase detecting system based on the use of a transmission device and a receiver device, applied in two points of the three-phase network, to cables that can belong to the same phase or to different phases. To identify the phase on which the receiver device is located, the transmission device sends a message on the electrical line to which it is connected, in phase with the voltage on said line. The receiver device recognizes the phase to which it is connected on the basis of the phase shift between the voltage waveform detected on the phase to which it is connected and the message received by the transmission device.

This system is particularly efficacious and useful, especially to rapidly identify the phases of a three-phase system in a complex electrical distribution network, but has the drawback that the transmission and receiver devices must be connected galvanically to the network cables. As it may be necessary to carry out various readings on different cables to identify a specific phase, this means that the insulation must be cut and then restored on a plurality of different cables for each operation, resulting in time loss, deterioration in the electrical insulation properties of cables and risk for operators taking the measurements.

US2004/263147 describes a phase detecting system based on a different concept. In this case the phases of a three-phase system are identified by detecting the phase shift between the voltage waveform and a time signal supplied by the GPS system. Phase shift between GPS signal and voltage waveform measured in two different points of an electrical distribution network allows identification of the phase. This system, particularly useful for very extensive networks, where the points in which the readings are carried out are at a distance even of several tens of kilometers from one another, has a substantial drawback arising from the fact that a GPS signal must be supplied in all points in which the phase of the system must be identified. Moreover, this system requires electrical contact with the network cable in order to detect and identify the phase.

SUMMARY OF THE INVENTION

According to one aspect, the invention provides a method and a device to identify the phases of a three-phase or generically multi-phase system, which overcome or reduce entirely or in part one or more of the drawbacks of conventional methods and devices.

One embodiment of the invention has the object of eliminating the need for a GPS signal to identify the phase of the multi-phase system.

An object of a further embodiment of the invention is to provide a device and a method that allow detection and identification of the phases in a multi-phase electrical system, wherein the phase detecting device does not require to be connected galvanically, in order to make operations faster and safer, avoiding the need to restore the insulation of cables after measurement.

In substance, the invention is based on the idea of detecting or reading a voltage or current waveform (or also both waveforms) on a cable belonging to one of the phases of the multi-phase electrical system and to store, for example in an electronic device, time data in phase with said waveform. By storing this data, a second detection of the same waveform (current and/or voltage) is then carried out in a second position of the three-phase system. The phase (L1, L2, L3) of the cable on which detection of the waveform is carried out in the second position is not known in advance. Data relative to the phase of the cable on which detection of the waveform is carried out in the second position is obtained on the basis of the phase shift between the two waveforms detected. This phase shift is determined by comparing the time course of the second waveform with the time data relative to the first waveform.

In general, the time data can be constituted by a timed pulse, in phase with a known point of the waveform. As the current and the voltage usually have a sinusoidal waveform, the time data that is stored can, for example, be a timed pulse at the same frequency as the line voltage or current, in phase with the maximum or with the minimum, or preferably with the voltage or current zero crossing. Phase shift between this signal and the maximum, the minimum, or the zero crossing of the waveform detected in the second position of the network allows identification of the phase on which the second reading, i.e. second detection, is carried out. For example, if it is known that the first detection was carried out on phase L1, and if the second waveform has zero phase shift with respect to the timed signal stored on the basis of the first waveform, then the cable on which the second waveform was read belongs to the same phase L1. This is also true in the case in which the two waveforms are in phase opposition, as in this case it simply means that the measurement was carried out inverting the connection between phase and neutral. If the phase on which the second reading is taken lags or leads by 120 electrical degrees, then the cable on which the second reading was taken belongs to phase L2 or to phase L3. To identify a cable belonging to phase L1 it is sufficient to carry out a number of readings sufficient to identify a waveform that has zero phase shift (or that is in phase opposition) with respect to the timed signal that was generated and stored.

In substance, according to one embodiment of the invention, there is provided a method comprising the steps of:

detecting a first voltage or current waveform on a phase of the multi-phase system, in a first position of said multi-phase electrical system;

storing timed data, in phase with said first waveform;

detecting a second voltage or current waveform in a second position of said multi-phase electrical system, on an indeterminate phase of said multi-phase system;

obtaining data relative to the phase on which the second waveform was read on the basis of the phase shift between said timed data and said second waveform.

Maintenance of the timed data, synchronized or in phase with the first waveform is, for example, obtained by generating a signal having the same frequency as the phase voltage or current, synchronized with the waveform, for example with the maximum point or with the minimum point, or preferably with the zero crossing. In practice, detection of the waveform can be carried out with a device in which the microcontroller has a sufficiently precise clock, so that once this microcontroller is moved away from the line, it stores data relative to the time course of the voltage, due to a time scale generated by the clock. It is sufficient for the microcontroller to generate a signal constituted by a sequence of pulses synchronized with a characteristic point of the waveform, e.g. with the zero crossing.

According to a different aspect, the invention relates to a phase detecting device, comprising: at least one sensor to detect a current or voltage waveform on a cable; and a control unit programmed to store timed data, in phase with said waveform detected through said at least one sensor; and wherein said control unit is also programmed to detect the phase shift between said timed data and a second waveform detected on a cable in a second position in said multi-phase system.

Further advantageous features and embodiments of the method and of the device according to the invention are described below and are indicated in the appended dependent claims.

Particular advantages are obtained if detection of the waveform is carried out without electrical contact with the conductors of the multi-phase system, as the need to break the electrical insulation of the cable and the subsequent need to restore this insulation is thereby avoided. Operations are therefore simpler, faster and safer. However, some of the advantages of the present invention are achieved also in the case in which detection of the waveform takes place with an electrical contact on the conductor.

In some embodiments of the invention, the method can include the steps of:

detecting a first waveform on a phase of the multi-phase system, in a first position or point of the multi-phase electrical system;

generating a cyclic signal synchronized with said first waveform and at the frequency of said first waveform;

detecting a second waveform in a second position or point of the multi-phase electrical system, on an indeterminate phase of said multi-phase system;

obtaining data regarding the phase on which the second waveform was detected on the basis of the phase shift between said second waveform and said cyclic signal synchronized with said first waveform.

In some embodiments, the method comprises the steps of:

detecting the zero crossing of a first waveform detected in a first point of the electrical distribution network;

generating a cyclic signal, synchronized with said zero crossing;

detecting the zero crossing of a second waveform in a second position or point of the network;

determining the phase shift between the zero crossing of said second waveform and said cyclic signal.

In some embodiments, the zero crossing of the second waveform is identified and the time phase shift between the zero crossings of the first and of the second waveform is identified. In some modified embodiments, instead of the zero crossing, another characteristic point of the voltage or current waveform, such as the maximum or the minimum, is detected, In some embodiments of the invention, through a control unit a time signal is generated at the same frequency as a first waveform and in phase, i.e. synchronized, therewith; through the control unit, the phase shift of a second waveform detected in the second point of the network with respect to the time signal generated by said control unit is detected.

BRIEF DESCRIPTION OF THE DRAWINGS

The invention will now be better understood by following the description and accompanying drawings, which show a practical non-limiting embodiment of the invention. More in particular, in the drawing.

FIGS. 9A, 9B and 9C show the current waveform measured in two distinct positions of an electrical distribution line or network in three different conditions;

FIG. 10 schematically shows the tables of the digitized current values obtained from the waveforms in FIGS. 9A, 9B and 9C;

FIGS. 11A, 11B and 11C show explanatory diagrams of the phase calculation methods by correlation (i.e. mutual correlation) of the two waveforms; and FIG. 12 schematically shows the correlation calculation through the sampled and digitized values of the two waveforms.

DETAILED DESCRIPTION OF AN EMBODIMENT OF THE INVENTION

Figure 1:
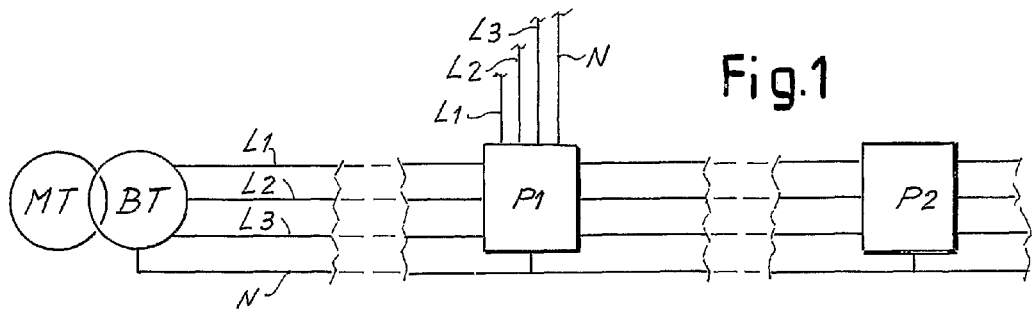
FIG. 1 schematically shows a portion of a three-phase electrical energy distribution network.
Figure 2:
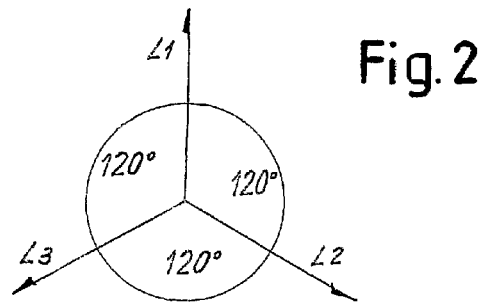
FIG. 2 shows the reciprocal phase shift between phase voltages in a vectorial representation.

FIG. 1 schematically shows an MV/LV (medium voltage/low voltage) transformer connecting a medium voltage three-phase network to a low voltage three-phase network for electrical energy distribution. The low voltage three-phase network has three phases L1, L2, L3 and neutral N. The phase voltages are phase-shifted by 120 electrical degrees, as shown schematically in FIG. 2 in vectorial form. The low voltage distribution network can even be very complex and have a plurality of junction or interconnection nodes or points. In the simplified diagram in FIG. 1 two interconnection or junction points P1 and P2 are shown. In practice, these can be constituted by interconnection boxes, in which sections of distribution lines to be interconnected with one another converge.

Each phase L1, L2, L3 at input and output of each of the interconnection points P1, P2 is in actual fact constituted by a bundle of cables in an adequate number to withstand the maximum current to be delivered through that specific portion of the distribution network.

In practice, protection ducts or pipes housing the cables of the various phases L1, L2, L3 and neutral N extend between the transformer and the junction points adjacent thereto, such as the point P1, as well as between the various points or nodes P1, P2 etc. of the network. In an existing network, it is very difficult to distinguish the cables of one phase from those of another, since they are not usually identified by any distinguishing characteristics, or can in any case lose these characteristics through time, e.g. as a result of aging, atmospheric agents or the like. It is therefore very difficult to identify, for example in the point P1, a cable belonging to specific phase L1, L2 or L3. Analogous difficulties can arise in identification of neutral.

On the other hand, in some cases it is necessary to identify a specific phase, e.g. phase L1, in each junction or interconnection point. This need can arise when electronic devices that communicate data, information and/or commands to one another and/or to a collection station via a power line modem (PLM), must be connected in various points of the network. In this case, it is advisable for all the devices to be connected on the same phase. The need to identify a specific phase in a multi-phase system can also arise in other circumstances, e.g. to connect motors, transformers or other electrical machinery in general, in phase, to balance, the loads on the various phases, etc.

Having identified the phase required (e. phase L1) in a point of the network, it is necessary to find a cable belonging to the same phase in a different point of the same network, e.g. in a different pit housing a junction or interconnection.

For this purpose, the invention provides for the use of a device indicated with 1 in the diagram in FIG. 3, with which measurements are carried out in different points of the network in the manner described below.

The device 1 comprises in general (FIG. 7) a microprocessor or a microcontroller 3, a user interface 5, which can comprise a display and optional keys or the like, a voltage sensor 7 and/or a current sensor 9. The number 11 indicates a device, such as a quartz crystal, which supplies a high precision time signal, used as time base for the device. The number 13 indicates a generic direct voltage source, such as a battery, which supplies the entire device 1 without it requiring to be connected to a power supply.

Figure 7:
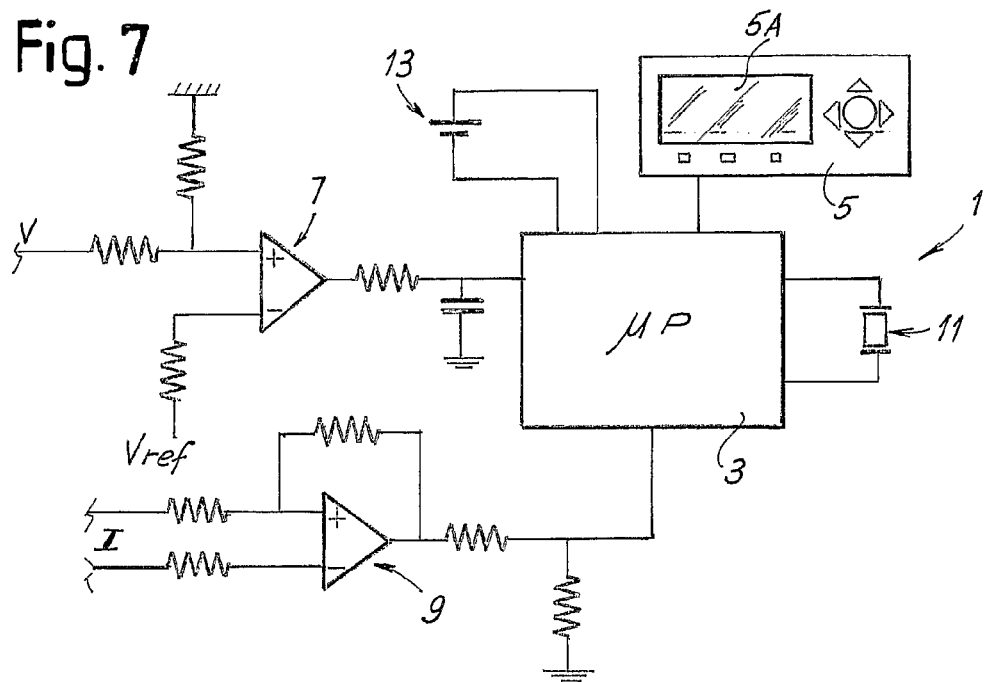
FIG. 7 shows a block diagram of the device according to the invention.

The diagram in FIG. 7 shows a device provided both with a current sensor and with a voltage sensor. However, it must be understood that the device can also be provided with only one of these sensors.

According to some preferred embodiments of the invention, the sensor(s) with which the device 1 is provided is/are capable of detecting the waveform (voltage or current respectively) without galvanic connection to the cables and consequently without the need to cut the cable to reach the bare conductor. For example, ammeter clamps or other known devices, which do not require galvanic connection to the phase to detect the current, can be used. Detection of the voltage can be achieved with a capacitive system, comprising two substantially cylindrical armatures, which can be fitted around the phase cable and the neutral, thereby forming two cylindrical capacitors, which can be connected to a detection circuit. The sinusoidal voltage generates an electrical field in the capacitor, which can be detected with a voltage signal by the circuit. The armatures can be formed by cylindrical sleeves cut along a generatrix to be fitted around the insulation of the cable.

Let us now suppose we are positioning the device 1 in a point P1 of the electrical network, of which a cable belonging, for example, to phase L1 and a cable belonging to neutral N have previously been identified. If the point P1 is the first point in which the entire operation starts, the cable in question can in fact belong to any phase and the object of the subsequent operations will be to find, at each relevant point of the network, for example in each junction or interconnection point, a cable belonging to the same phase. Hereunder the phase identified in the first step of the phase detection process will be generically indicated as phase L1. The point P1 can, for example, be the output of an MV/LV transformer or a junction or interconnection point or the like.

After fitting the current sensor 9 to the cable of phase L1 and/or the voltage sensor 7 to the cable of phase L1 and of the neutral N, the device 1 can detect and store the waveform. As the device 1 has a time scale generator, it can store data relative to the voltage (V) and/or current (I) waveform in phase with a time scale. Below, for the sake of brevity reference will only be made to the voltage signal V(t), but it must be understood that the device can also function on the basis of the current waveform or can use both.

Figure 4:
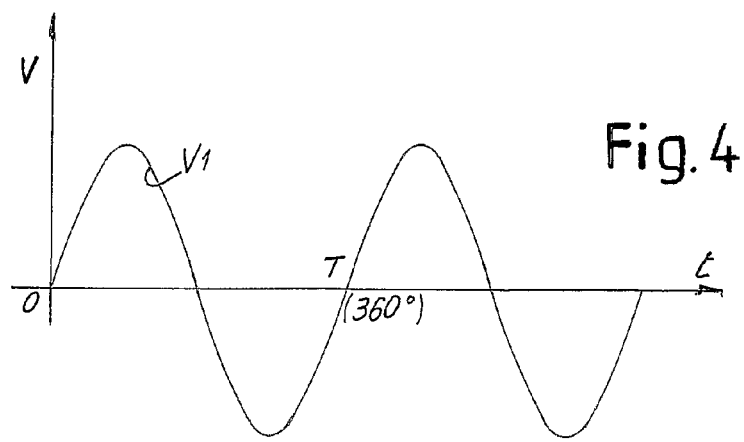
FIG. 4 shows the voltage course in a first detection point.
Figure 5:
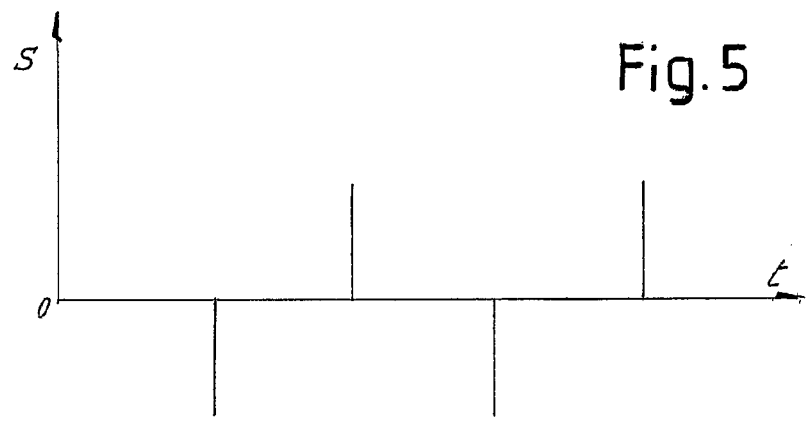
FIG. 5 shows an example of data that is stored by the phase detecting device.

FIG. 4 shows a sinusoidal voltage waveform V(t), of which T indicates the period equal to 360 electrical degrees. The waveform has a zero crossing every 180° and a frequency that can typically be 50 or 60 Hz, depending on country. The device 1 can store the entire waveform or characteristic points of the curve V(t), e.g. the zero crossings, or the maximum and minimum points. FIG. 5 shows by way of example a signal S constituted by a series of pulses in phase with the zero crossings of the network voltage V(t). Once the voltage V(t) reading has been carried out, the device 1 can store the time course of this waveform simply by periodically reproducing the signal S(t), due to the time scale supplied by the quartz crystal 11 or other component suitable for this purpose.

As the device 1 is supplied by a dedicated battery 13, it can be detached from the line and transferred to another point of the network, storing the time data relative to the network voltage course. In other words, the microcontroller can continue to generate pulses S(t) in phase with the zero crossing of the voltage on phase L1.

The pulses S(t) can be synchronized, rather than with the zero crossing, with the maximum and minimum points of the curve V(t) or with any other characteristic point thereof. The zero crossing is simpler and less influenced by possible distortions of the waveform and may therefore be preferable with respect to other points of the curve.

To identify phase L1 in a different point P2 of the network, such as a pit in which a different interconnection or junction of the network is located, the procedure below is followed. The voltage sensor 7 (or current sensor 9) is connected to a generic cable and to neutral N. As it is generally not possible to detect which phase the various cables concentrated in the point P2 belong to, in the diagram in FIG. 3 the three phases are indicated with X, Y and Z. Each phase X, Y and Z corresponds to one of the phases L1, L2 and L3, but this correspondence is unknown. N indicates neutral, which is presumed in this example to be recognizable with respect to the phase cables.

Figure 3:
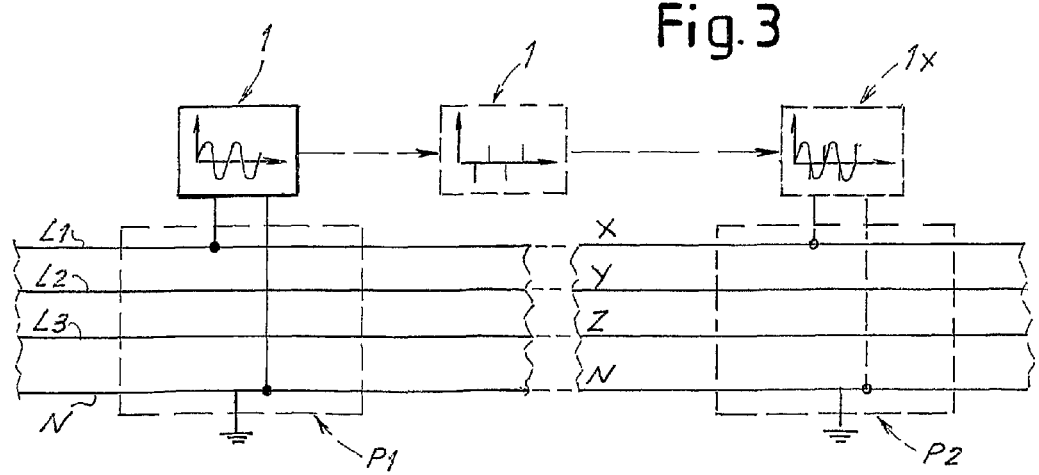
FIG. 3 schematically shows a portion of three-phase network on which a phase detecting operation is carried out by a device according to the invention.

In the diagram in FIG. 3 the device 1 is indicated with a continuous line in the position P1 and with a dashed line in the position P2, to represent the fact that this device is transferred from the point P1 to the point P2. The device remains switched on during transfer, so that it can continuously regenerate the signal S(t) synchronized with the voltage zero crossing V(t) on phase L1.

Once the voltage sensor of the device 1 has been connected to the generic and unknown phase X and to neutral in the point P2, the microcontroller 3 can acquire a waveform of the network voltage Vx(t) on this generic phase X. On the basis of the phase shift between the signal S(t) and the signal Vx(t), the device 1 is able to verify whether the phase X corresponds to phase L1, L2 or L3. In fact, if the phase shift between the curve Vx(t) and the signal S(t) is equal to zero, the cable on which the device 1 is connected is phase L1. If the signal lags or leads by 120°, the cable belongs to phase L2 or L3. It must be understood that the lead or lag is in this case determined on the basis of the zero crossing of the curve Vx(t) and by comparing this to the signal S(t).

Figure 6:
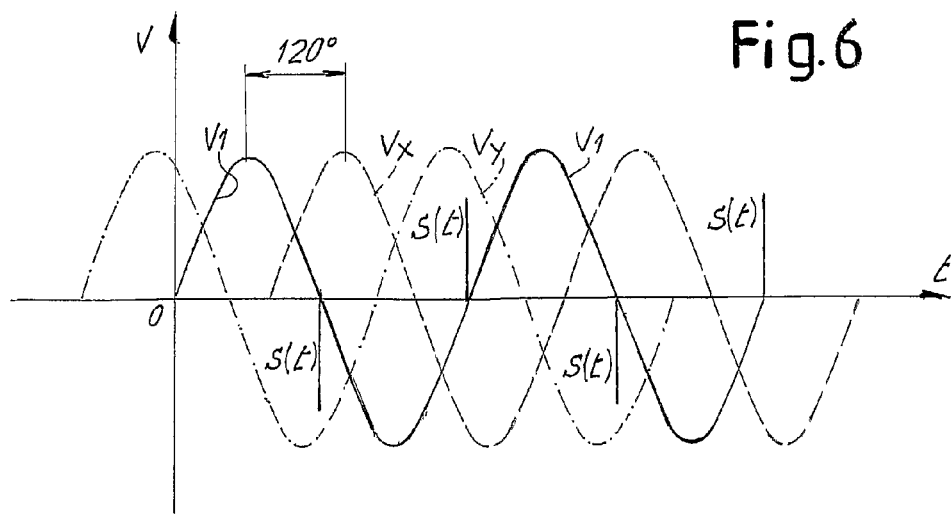
FIG. 6 shows the voltage course in a second detection point, superimposed on the voltage waveform detected in the first detection point.

FIG. 6 schematically shows with a dashed line the curve V1 representing the network voltage on the line L1, while Vx represents the voltage leading by 120° and Vy represents the voltage lagging by 120°. The signal S(t) is in phase with V1 while it is phase shifted by 120°, leading and lagging respectively, in relation to the curves Vx and Vy.

By attempts, repeating the measurement on the various cables, it is thus possible to identify a cable belonging to the line L1. If in the point of the network considered there is only one cable for each phase, in the worst case two measurement attempts will be sufficient.

If the voltage V(t) (or current I(t)) waveform in the point P2 has a phase shift of 180° with respect to the signal S(t), the cable identified is again of phase L1, but the sensor has been connected switching the phase connection with the neutral connection.

In the above description it was presumed that neutral N is distinguishable from the cables of phases L1, L2 and L3. In this case the voltage that is read by the device is the phase voltage with respect to neutral. However, the system also works if the neutral cable cannot be distinguished from the others and consequently also in the case in which connection of the device is implemented with a further degree of uncertainty.

In this case, in fact, detection can, for example, be carried out in two steps. In a first step the device 1 is connected between any two cables and reads the voltage between the terminals. If this is zero, it means that the cables chosen both belong to the same phase or are both neutral. If the voltage is equal to the phase-phase voltage, the connection is modified until the voltage detected is the one between phase and neutral. The aforesaid process is then repeated to identify which of the three phases L1, L2 or L3 has been engaged by the receiver.

Alternatively, the measurement could be carried out even if the connection is made between two phases, rather than between phase and neutral. In fact, in this case, with respect to the voltage on phase L1, the voltage will in any case have a phase shift that depends on which of the two phases have been engaged by the device 1 and in which of the two possible configurations. Detection of the zero crossing of the phase-phase voltage, and detection of the delay as described above, again allow the phases and the position in which they are connected to the device to be identified.

If detection is carried out with an ammeter clamp or another current sensor, it is connected only to one cable. If this is neutral, the clamp does not provide a signal, or typically provides a lower signal with respect to the one present on the other cables, and therefore the measurement is repeated on another cable. If the clamp is connected in the inverted position with respect to the one of the first measurement, this will cause a phase shift of 180° of the waveform, easily detectable, just as it is easy to detect inversion of the connections between phase and neutral of the two terminals of a voltage sensor.

Figure 8:
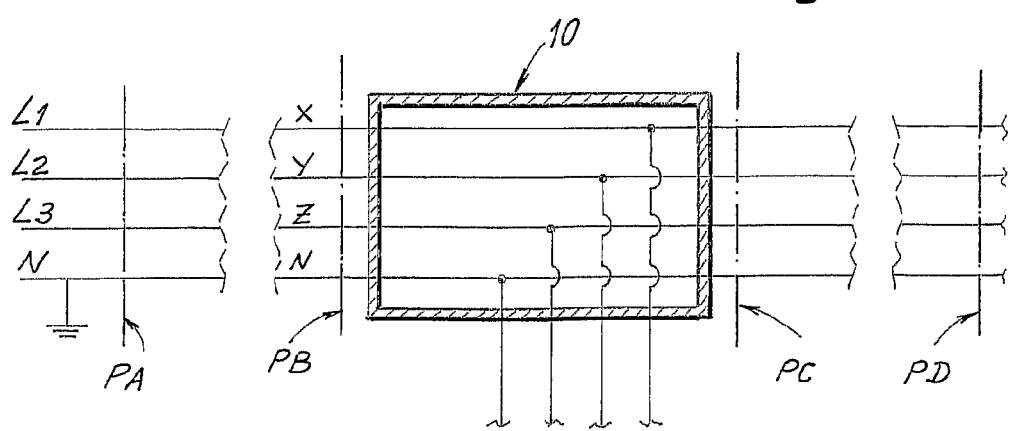
FIG. 8 shows a diagram of a portion of line with a junction, and the positions in which the measurements are carried out in this case.

If a junction box is located along the line on which the measurements are taken, as shown for example in FIG. 8 with the number 10, it is advisable for detection to be carried out upstream and downstream of the junction box, as this can cause a phase shift of the waveform. In this case, if PA is the position in which the first detection is carried out on a cable of the line L1, a second detection will be carried out in the point PB upstream of the junction. A further detection will be carried out in the point PC, directly downstream of the junction. In the point PB the cable of the line L1 is identified. In the point PC a new detection is carried out on the same cable already identified, to exclude the effect of phase shift caused by the junction from the measurement. The result of this detection in the point PC is used for comparison with the detection in the subsequent point PD and to find phase L1 in the point PD.

The above refers to sinusoidal or substantially sinusoidal waveforms, in which, for example, the zero crossing point is easily identifiable and this point can be referred to find the phase shift of two curves substantially of the same shape. This assumption is correct or acceptable in the case of voltage detection, while it is not always correct in the case in which current waveform is used. In fact, this is normally highly distorted as a result of the nature of the loads connected to the network. In this case, the waveform can be detected for an adequate time, e.g. a period, in two subsequent points of the network and the two waveforms detected in the two points can be sampled, subsequently determining their mutual correlation for different values of the reciprocal phase shift between them.

This process is described in greater detail with reference to FIGS. 9, 10, 11 and 12.

Let us suppose that a current waveform C1, having the shape indicated qualitatively on the left in FIG. 9A, 9B or 9C, is detected in a point or position PA on a cable of phase L1. The operator acquires the waveform through an ammeter clamp of the device for a time interval equal to at least a period T, from the time T* to the time (T*+T). The time interval T is equal to 20 ms in the case of electrical network at 50 Hz and 16.6666 ms in the case of network at 60 Hz. In the schematic diagram in FIGS. 9A, 9B and 9C the acquisition and sampling time interval starts in the instant in which the current curve crosses the zero. However, this circumstance is only motivated by ease of representation, as it is not the moment in which acquisition and sampling of the curve starts that is important, but only the fact that the current curve in the second position occurs in a time coordinated manner with respect to detection of the curve of the first point, as will be explained below.

The analog signal can be sampled and digitized, in order to store a table of the current values, with sufficient precision adopting an adequate sampling interval. In FIG. 10 the reference A schematically indicates a table of values thus obtained on the time interval T, corresponding to an interval of 360 electrical degrees.

At this point, the operator transfers the device to the second point PB, where a cable belonging to the same phase L1 requires to be found. The ammeter clamp is fitted to a cable in the point PB and the waveform C2 of the current is acquired, sampled and digitized for a period T, qualitatively having the form indicated on the right in FIG. 9A, 9B or 9C. As the device stores the time data, i.e. via the internal clock generates, for example, timed pulses at the network frequency starting from the instant T* in which acquisition of the curve C1 started, it is possible to acquire a waveform between the instant (T*+kT) and the instant [T*+(k+1)T] in the point PB, as shown in FIG. 9A, 9B or 9C. By sampling and digitizing this waveform C2, a series of numerical values are obtained, constituting a second table of values, indicated with B in FIG. 10. By calculating the mutual correlation between the two tables (and therefore between the two curves), the phase shift of the two sampled and digitized signals is determined and the phase on which the second acquisition was carried out is consequently identified.

More in particular, considering the tables A and B in FIG. 10 as circular tables, in which the first value is the one sampled at the instant T* for the curve C1 and at the instant T*+kT for the curve C2, and the last value is the one sampled at the instant T*+T for the curve C1 and at the instant T*+(k+1)T for the curve C2, it is possible to calculate the mutual correlations between the two curves for three different reciprocal phase shifts 0°, 120° and 240°. This is equivalent to translating the curves C1 and C2 with respect to each other superimposing the instants T* and T*+kT, or phase shifting them by T/3 and ⅔ T respectively. If the two signals are in phase, i.e., if the two acquisitions were carried out on cables belonging to the same phase, the maximum correlation is attained when the phase shift between the two tables A and B is equal to 0 electrical degrees. Otherwise, the maximum correlation value is attained by a phase shift of 120° or of 240°, with which data relative to the phase on which the second reading was taken is obtained.

By indicating with
C1($i$) with $1 \leq i \leq N$ the values of the samples acquired for the curve C1
C2($i$) with $1 \leq i \leq N$ the values of the samples acquired for the curve C2 the mutual correlation is calculated $$MC_0 = \sum_{i=1}^{i=N} C1(i) * C2(i)$$

$$MC_{120} = \sum_{i=1}^{i=N} C1(i) * C2(i + i_{120})$$

$$MC_{240} = \sum_{i=1}^{i=N} C1(i) * C2(i + i_{240})$$

where $i_j$ indicates the sample acquired with a phase shift equal to J electrical degrees with respect to the first sample (for example, $i_{120}$ is the sample at 120° with respect to the first, therefore with regard to the curve C2 it is the sample acquired at T*+(k+⅓)T). The phase on which acquisition of the second curve was carried out is determined on the basis of the maximum between the three mutual correlation values $MC_0$, $MC_{120}$ and $MC_{240}$ indicated above. If the maximum value is $MC_0$, the cable on which detection of the curve C2 was carried out belongs to the same phase on which the curve C1 was detected. If the maximum is $MC_{120}$ or $MC_{240}$ the second curve is phase shifted by 120° or by 240° respectively.

More in particular, to identify the phase reference will be made to the absolute value of the correlation, as $$\cos(\alpha)*\cos(\alpha) = -\cos(\alpha)*\cos(\alpha+x)$$

while the sign can indicate phase inversion.

In FIGS. 11A, 11B, 11C the criterion described above is represented graphically with reference to the curves C1 and C2 acquired in the two points PA and PB as illustrated above with reference to FIGS. 9A-9C. The three figures show curves highly distorted with respect to the sinusoidal curve. The form of the curves is not intended to represent a particular real situation, but only to show a condition in which the waveform is also markedly different from a sinusoid.

The two curves have been translated in order to take the instant T*+kT in which acquisition of the curve C2 starts to coincide with the instant T* in which acquisition of the curve C2 starts. If the curves C1 and C2 were acquired on cables belonging to the same phase, i.e. in the case in FIG. 9B, by translating the curves to superimpose the time instants T* and T*+kT, a substantial superimposing of the curves is obtained, as shown in FIG. 11B. In the case in FIG. 9A, where the curve C2 is delayed by 120 electrical degrees, it can be seen in FIG. 11A that the maximum correlation between the two curves is obtained, in this case, by translating them by −120°. In the case in FIG. 9C, where the curve C2 is leading by 120°, the maximum correlation is obtained by translating the curves by +120°.

Proceeding in this manner, it is possible to obtain correct identification of the phase in point B even if the waveforms detected are highly distorted and different from each other in the two points A and B.

In some embodiments of the device according to the invention, the device 1 can be settable to function with different network frequencies. For example, it is possible to select between an operating mode at 50 Hz and an operating mode at 60 Hz, to allow the same device to be used on different networks. In other embodiments, the network frequency can be detected automatically by determining the zero crossing of the waveform detected (voltage or current). On the basis of time scanning supplied by the quartz of the circuit, the device can determine the network frequency by detecting the zero crossings and consequently automatically set operation to 50 Hz or 60 Hz (or any other network frequency value).

With respect to the devices and to the methods described in WO-A-2006/100695, the method and the device according to the present invention have the advantage of not requiring galvanic contact between the device and the network cable. Moreover, phase detection is faster, as it does not require repeated operations to install and remove a pair of devices in various points of the electrical network. With a single device it is possible to perform in sequence detection of the phase in each point of interest along the electrical energy distribution network. As no message is transmitted on the electrical network, as is instead the case in prior art, with the system according to the invention no difficulties arise due, for example, to disturbances on the network which can cause problems in transmission of the message via PLM. It is also possible to detect the phase in a point P2 at a noteworthy distance from the initial point P1, where the distance between the two points is such as to preclude transmission of a message on the line, also due to the disturbances present on this line.

With respect to the systems using the GPS signal, the method according to the invention has the advantage of not being bound to the presence of this signal. In some embodiments, the invention is also more versatile, as it can operate at different network frequencies simply by setting the operating mode (i.e. 50-60 Hz).

It is understood that the drawing only shows a practical embodiment of the invention, which can vary in forms and arrangements without however departing from the scope of the concept on which the invention is based. Any reference numbers in the appended claims are provided purely to facilitate reading thereof in the light of the description above and of the accompanying drawings and do not limit the scope of protection in any way.

The invention claimed is:

1. A method to identify a phase in a multi-phase electrical system, comprising:
   providing a detection device having at least one sensor operable to detect a waveform on a cable of a multi-phase electrical system and a control unit that generates a time reference, the time reference being timed according to the frequency of the waveform and in phase therewith, to store timed data, synchronized with a detected waveform;
   using the detection device to detect a first waveform on a cable belonging to a first phase of the multi-phase system, in a first position of the multi-phase electrical system;
   storing in the detection device timed data, synchronized with the first waveform;
   moving the detection device to a second position on a different point of the multi-phase electrical system; and
   in the second position, finding a cable belonging to the first phase by
   (a) using the detection device to detect a second waveform in the second position of the multi-phase electrical system, on a cable belonging to an indeterminate phase of the multi-phase system,
   (b) obtaining data relative to the phase to which the cable, on which the second waveform was read, belongs based on the phase shift between the timed data stored in the detection device at the first position and the second waveform, and
   (c) repeating steps (a) and (b) until a cable is identified, on which the phase shift is zero or 180°.

2. The method of claim 1, wherein the multi-phase system is a three-phase system.

3. The method of claim 1, wherein the waveform is the current waveform.

4. The method of claim 1, wherein the waveform is the voltage waveform.

5. The method of claim 1, wherein the waveform is read without electrical contact with the conductors of the multi-phase system.

6. The method of claim 1, further comprising the steps of:
   detecting the first waveform on a phase of the multi-phase system, in a first position of the multi-phase electrical system;
   generating a cyclic signal synchronized with the first waveform and at the frequency of the first waveform; and
   detecting a second waveform in a second position of the multi-phase electrical system, on an indeterminate phase of the multi-phase system; obtaining data relative to the phase on which the second waveform was detected on the basis of the phase shift between the second waveform and the cyclic signal synchronized with the first waveform.

7. The method of claim 1, further comprising the steps of:
   detecting the zero crossing of the first waveform;
   generating a cyclic signal, synchronized with the zero crossing;
   detecting the zero crossing of the second waveform; and
   determining the phase shift between the zero crossing of the second waveform and the cyclic signal.

8. The method of claim 1, wherein:
   through the control unit, a time signal is generated at the same frequency as the first waveform and in phase therewith; and
   through the control unit the phase shift of the second waveform is detected with respect to the time signal generated by the control unit.

9. The method of claim 1, wherein in the second position a cable belonging to the same phase on which the first waveform was read in the first position is identified as the cable on which the second waveform is in phase or phase shifted with respect to the timed data.

10. The method of claim 1, further comprising the steps of:
    detecting, sampling and digitizing the first waveform;
    detecting, sampling and digitizing the second waveform;
    calculating a correlation value between the two waveforms;
    determining the phase on which the second waveform was detected on the basis of the correlation value.

11. The method of claim 10, wherein the correlation value is calculated for a plurality of reciprocally phase shifted positions of the waveforms, and wherein the phase on which the second waveform was detected is determined on the basis of the maximum of the correlation value.

12. The method according claim 11, wherein the correlation value is calculated in absolute value.

13. The method of claim 1, further comprising the steps of:
    detecting, sampling and digitizing the first waveform in a first time interval substantially equal to at least a period of the waveform;
    detecting, sampling and digitizing the second waveform for a second time interval substantially equal to at least a period of the second waveform, the second time interval starting in a time instant delayed by a multiple of the period with respect to the time instant in which detection of the first waveform starts;
    determining the phase shift between the two waveforms on the basis of a correlation between the two waveforms.

14. The method of claim 13, wherein the sampled and digitized values of the first and of the second waveform are stored in circular tables, and wherein the values are correlated with each other by phase shifting the tables by 0, 120 and 240 electrical degrees respectively, the phase shift between the two waveforms being equal to the reciprocal phase shift of the two tables for which the maximum correlation value is obtained.

15. A phase detection device to identify a phase in a multi-phase electrical system, comprising:
    at least one sensor functional to detect a waveform on an electrical cable in a first position of the multi-phase system;
    a control unit functional to generate a timed signal with the waveform detected and in phase therewith and to store timed data, synchronized with a first waveform detected through the at least one sensor;
    the control unit is further functional to detect a phase shift between the timed data and a second waveform detected on a cable in a second position in the multi-phase system; and
    wherein the control unit is further functional to
    detect, sample and digitize the first waveform,
    detect, sample and digitize the second waveform,
    calculate a correlation value between the two waveforms, and
    determine the phase on which the second waveform was detected on the basis of the correlation value.

16. The device of claim 15, wherein the control unit is further functional to
    calculate the correlation value for a plurality of reciprocally phase shifted positions of the waveforms, and
    determine the phase on which the second waveform was detected on the basis of the maximum of the correlation value.

* * * * *